(12) United States Patent
Chang et al.

(10) Patent No.: US 10,010,003 B2
(45) Date of Patent: Jun. 26, 2018

(54) CASING

(71) Applicant: Wistron Corporation, New Taipei (TW)

(72) Inventors: Cheng-Tang Chang, New Taipei (TW); Shin-Yi Hsieh, New Taipei (TW); Yi-Ting Hsu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days. days.

(21) Appl. No.: 15/396,820

(22) Filed: Jan. 3, 2017

(65) Prior Publication Data

US 2018/0132367 A1 May 10, 2018

(30) Foreign Application Priority Data

Nov. 7, 2016 (TW) .............................. 105136150 A

(51) Int. Cl.
*H05K 5/02* (2006.01)
*H05K 7/14* (2006.01)

(52) U.S. Cl.
CPC ......... *H05K 5/0226* (2013.01); *H05K 5/0221* (2013.01); *H05K 7/1487* (2013.01)

(58) Field of Classification Search
CPC .. H05K 5/0226; H05K 5/0221; H05K 7/1487; H05K 7/16; H05K 5/0217; H05K 7/1488; G06F 1/1681; G06F 1/1679; G06F 1/181; E05Y 2900/606; G11B 33/022; G11B 33/027; E05D 3/06; E05D 3/12; E05D 3/125; E05D 3/127; E05D 15/10; E05D 15/1005; E05D 15/1013; E05D 15/1015; E05D 2003/163; E05D 2003/166; E05D 2015/1026; E05D 3/14; E05D 3/142; E05D 3/145; E05D 3/147; E05D 3/16; E05D 3/18; E05D 3/183; E05D 3/186
USPC .................. 312/223.1, 223.2, 325, 326, 329; 361/724–727; 16/348, 357, 360, 366, 16/368, 369, 370, 371
See application file for complete search history.

(56) References Cited

U.S. PATENT DOCUMENTS

| | | | | |
|---|---|---|---|---|
| 526,019 A | * | 9/1894 | Brown ...................... | E05D 3/18 16/358 |
| 698,468 A | * | 4/1902 | Dietz ........................ | E05D 3/18 16/358 |
| 758,530 A | * | 4/1904 | Gross ..................... | A47C 17/86 16/368 |
| 3,759,475 A | * | 9/1973 | Brown ..................... | H02B 1/36 248/277.1 |

(Continued)

Primary Examiner — Hiwot E Tefera
(74) Attorney, Agent, or Firm — JCIPRNET

(57) ABSTRACT

A casing including a first casing body, a second casing body, at least one first linkage, and a second linkage is provided. The first casing body has a first end portion. The second casing body is movably connected to the first casing body, wherein the second casing body has a second end portion, and the first end portion and the second end portion are abutted against each other or separated from each other. The first linkage is disposed adjacent to the first end portion and pivoted to the first casing body. The second linkage is disposed adjacent to the second end portion, wherein the second linkage is pivoted to the second casing body and the first linkage, and the first casing body and the second casing body are respectively located at two opposite sides of the first linkage and the second linkage.

8 Claims, 6 Drawing Sheets

(56) References Cited

U.S. PATENT DOCUMENTS

| | | | | |
|---|---|---|---|---|
| 4,429,933 | A * | 2/1984 | Sokolowski | E05C 17/32 16/333 |
| 4,729,616 | A * | 3/1988 | Vogt | A47B 88/48 220/23.4 |
| 4,827,569 | A * | 5/1989 | Mertes | E05D 3/16 16/288 |
| 5,283,714 | A * | 2/1994 | Tsai | G06F 1/1632 312/330.1 |
| 6,402,270 | B1 * | 6/2002 | Frank | A47F 3/005 16/366 |
| 7,886,407 | B2 * | 2/2011 | Resnik | E05D 3/16 16/286 |
| 8,265,719 | B2 * | 9/2012 | Lindvall | G06F 1/1616 16/341 |
| 8,904,709 | B2 * | 12/2014 | Ajiki | E05C 17/32 312/319.2 |
| 9,810,476 | B2 * | 11/2017 | Kim | F25D 23/028 |
| 2003/0151334 | A1 * | 8/2003 | Chen | G06F 1/181 312/223.2 |
| 2012/0146470 | A1 * | 6/2012 | Katz | E05D 5/023 312/225 |
| 2012/0299455 | A1 * | 11/2012 | Li | H05K 5/0226 312/293.3 |
| 2013/0169135 | A1 * | 7/2013 | Wang | H05K 5/0221 312/326 |
| 2013/0221825 | A1 * | 8/2013 | Bonomie | E05F 3/20 312/405 |
| 2013/0257238 | A1 * | 10/2013 | Herron | A47B 96/00 312/209 |
| 2015/0008810 | A1 * | 1/2015 | Ivey | H05K 7/16 312/248 |
| 2016/0150665 | A1 * | 5/2016 | Zheng | H05K 7/1488 361/679.58 |
| 2016/0320811 | A1 * | 11/2016 | Lin | G06F 1/1681 |

* cited by examiner

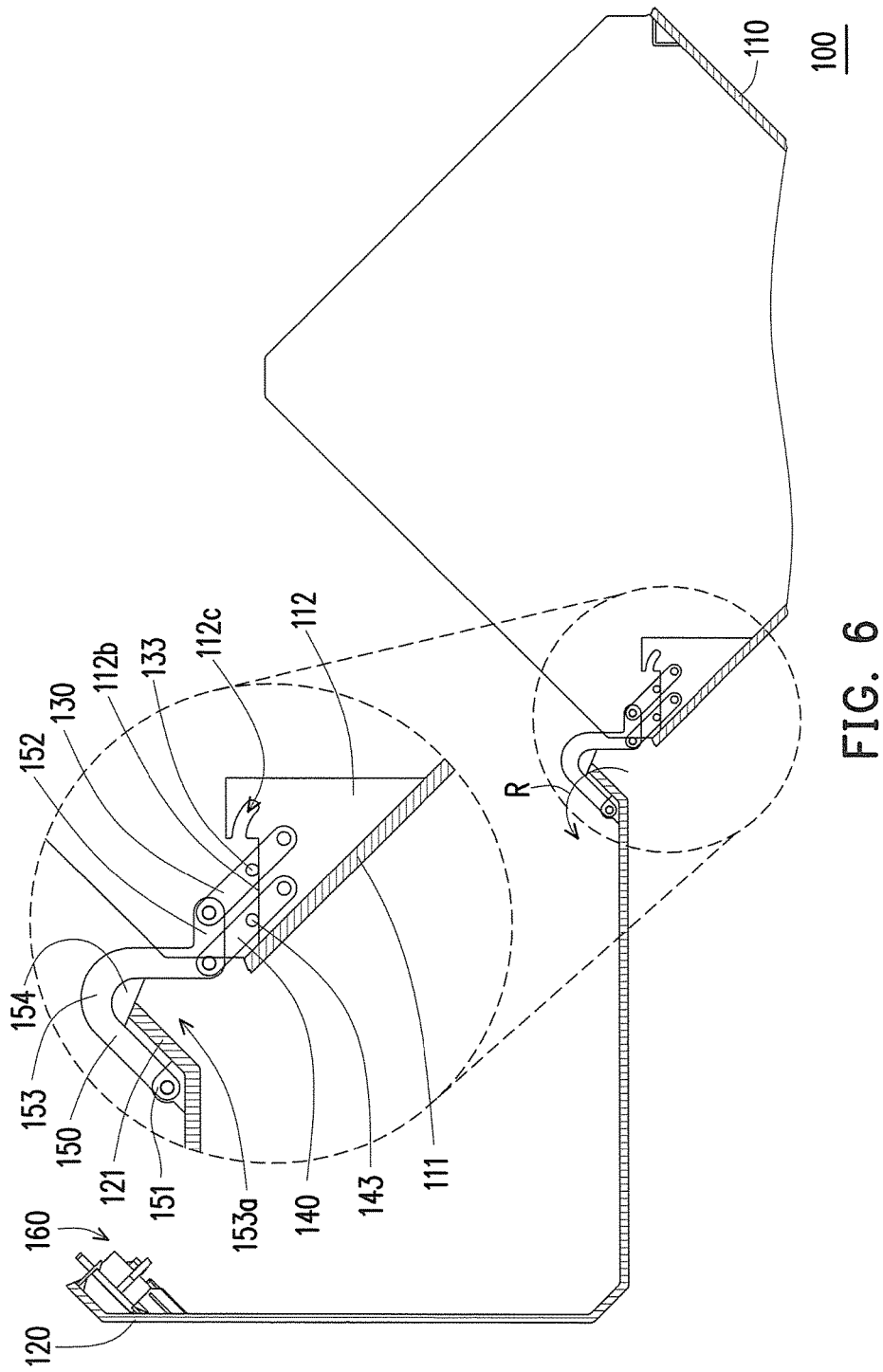

CASING

CROSS-REFERENCE TO RELATED APPLICATION

This application claims the priority benefit of Taiwan application serial no. 105136150, filed on Nov. 7, 2016. The entirety of the above-mentioned patent application is hereby incorporated by reference herein and made a part of this specification.

BACKGROUND OF THE INVENTION

Field of the Invention

The invention relates to a casing, and particularly relates to a casing of a server or computer host.

Description of Related Art

Electronic components are mostly assembled in a casing of a common server, a computer host, or an expansion device, so as to prevent the electronic components from damage by external forces or collisions of foreign objects. To facilitate to repair or replace the electronic components, the casing is mostly composed of two casing bodies. The two casing bodies are locked to each other through a screw, or pivoted to each other through a pivot axis. The two casing bodies should be separated from each other by disassembling the screw or by making the two casing bodies be rotated relative to each other through the pivot axis when necessary.

The casing that the two casing bodies pivoted to each other through the pivot axis is taken as an example. The pivot axis is mostly exposed outside the casing, and an appearance integrity of the casing is damaged. On the other hand, when the two casing bodies are fixed to each other, an end portion of one of the casing bodies and an end portion of another one of the casing bodies will be abutted against each other. If the pivot axis is disposed in the casing, the two end portions abutted against each other will generate structural interference in the process of making the two casing bodies be rotated relative to each other through the pivot axis. Thus, the two casing bodies can not be separated from each other by relative rotation through the pivot axis.

SUMMARY OF THE INVENTION

The invention provides a casing, two casing bodies of which do not generate structural interference when opening and closing.

The invention provides a casing including a first casing body, a second casing body, at least one first linkage, and a second linkage. The first casing body has a first end portion. The second casing body is movably connected to the first casing body, wherein the second casing body has a second end portion, and the first end portion and the second end portion are abutted against each other or separated from each other. The first linkage is disposed adjacent to the first end portion and pivoted to the first casing body. The second linkage is disposed adjacent to the second end portion, wherein the second linkage is pivoted to the second casing body and the first linkage, and the first casing body and the second casing body are respectively located at two opposite sides of the first linkage and the second linkage. When the second end portion and the first end portion are abutted against each other, the second casing body can be moved relative to the first casing body through the second linkage and the first linkage so as to make the second end portion be separated from the first end portion.

According to an embodiment of the invention, the first casing body includes a first base and a second base arranged side-by-side. The first linkage has a first pivot portion and a second pivot portion opposite to each other. The first pivot portion is pivoted to the first base and the second base. The second pivot portion is pivoted to the second linkage.

According to an embodiment of the invention, the first base has a sliding groove. A number of the first linkage is two, and the two first linkages are parallel to each other. One of the first linkages is provided with a first pin located between the corresponding first pivot portion and the second pivot portion. Another one of the first linkages is provided with a second pin located between the corresponding first pivot portion and the second pivot portion. The first pin and the second pin are respectively disposed corresponding to the first base. When the second end portion and the first end portion are abutted against each other, the first pin is slidably disposed in the sliding groove and abutted against a bottom of the sliding groove. The second pin is located outside the sliding groove.

According to an embodiment of the invention, the first base further has a stopper portion. The stopper portion is located at a side of the sliding groove, and the second pin is abutted against the stopper portion. After the second casing body is moved relative to the first casing body through the second linkage and the two first linkages so as to make the second end portion be separated from the first end portion, the first pin is moved along the sliding groove, and the first pin and the second pin are moved toward the stopper portion. When the two first linkages are perpendicular to the stopper portion, the first pin is located in the sliding groove, and the first pin and the second pin are separated from the stopper portion. When the two first linkages are inclined to the stopper portion, the first pin is located outside the sliding groove, and the first pin and the second pin are abutted against the stopper portion.

According to an embodiment of the invention, the second linkage has a third pivot portion and a fourth pivot portion opposite to each other. The third pivot portion is pivoted to the second casing body, and the fourth pivot portion and each of the second pivot portions are pivoted to each other.

According to an embodiment of the invention, the first base further has a limit portion. The limit portion is located above the sliding groove. When the second end portion and the first end portion are abutted against each other, the fourth pivot portion and the limit portion are abutted against each other.

According to an embodiment of the invention, the second linkage has a bending portion connected to the third pivot portion and the fourth pivot portion. The bending portion defines an abdicate groove. The abdicate groove faces the first base. When the two first linkages are inclined to the stopper portion, and the first pin and the second pin are abutted against the stopper portion, the fourth pivot portion is parallel to the stopper portion, and the second casing body is capable of rotating relative to the third pivot portion so as to make the second end portion move in the abdicate groove.

According to an embodiment of the invention, the casing further includes an elastic member. The elastic member is connected to the first linkage and the second base. When the second end portion and the first end portion are abutted against each other, the elastic member is compressed between the first linkage and the second base.

According to an embodiment of the invention, the casing further includes a switch assembly. The switch assembly and the elastic member are respectively located at two opposite sides of the first casing body, and the switch assembly is configured to fix or unfix the first casing body and the second casing body.

According to an embodiment of the invention, the switch assembly includes an actuating member and a latching member. The actuating member is pivoted to the second casing body and located between the first casing body and the second casing body. The latching member is pivoted to the actuating member. The latching member has a plurality of first latching portions. The first casing body has a plurality of second latching portions and a plurality of first limit portions. The second casing body has a plurality of second limit portions. Each of the first latching portions and the corresponding second latching portion are latched to each other. The first limit portions and the second limit portions are respectively located at two opposite sides of the latching member, and are respectively mechanically coupled to the latching member. When the actuating member is rotated relative to the second casing body along a rotation direction, the latching member is moved along a moving direction driven by the actuating member and limited to the first limit portions and the second limit portions, so as to make each of the first latching portions be separated from the corresponding second latching portion.

Based on the above, the linkage assembly of the invention is disposed in the casing. Thus, the appearance integrity of the casing can be maintained. On the other hand, the first casing body and the second casing body can be connected to each other through the linkage assembly, wherein the second casing body can be moved relative to the first casing body through the linkage assembly and without generating the structural interference with the first casing body.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 and FIG. 6 are schematic views of a second casing body of FIG. 4 moving relative to a first casing body to be separated from the first casing body.

DESCRIPTION OF THE EMBODIMENTS

Figure 1:
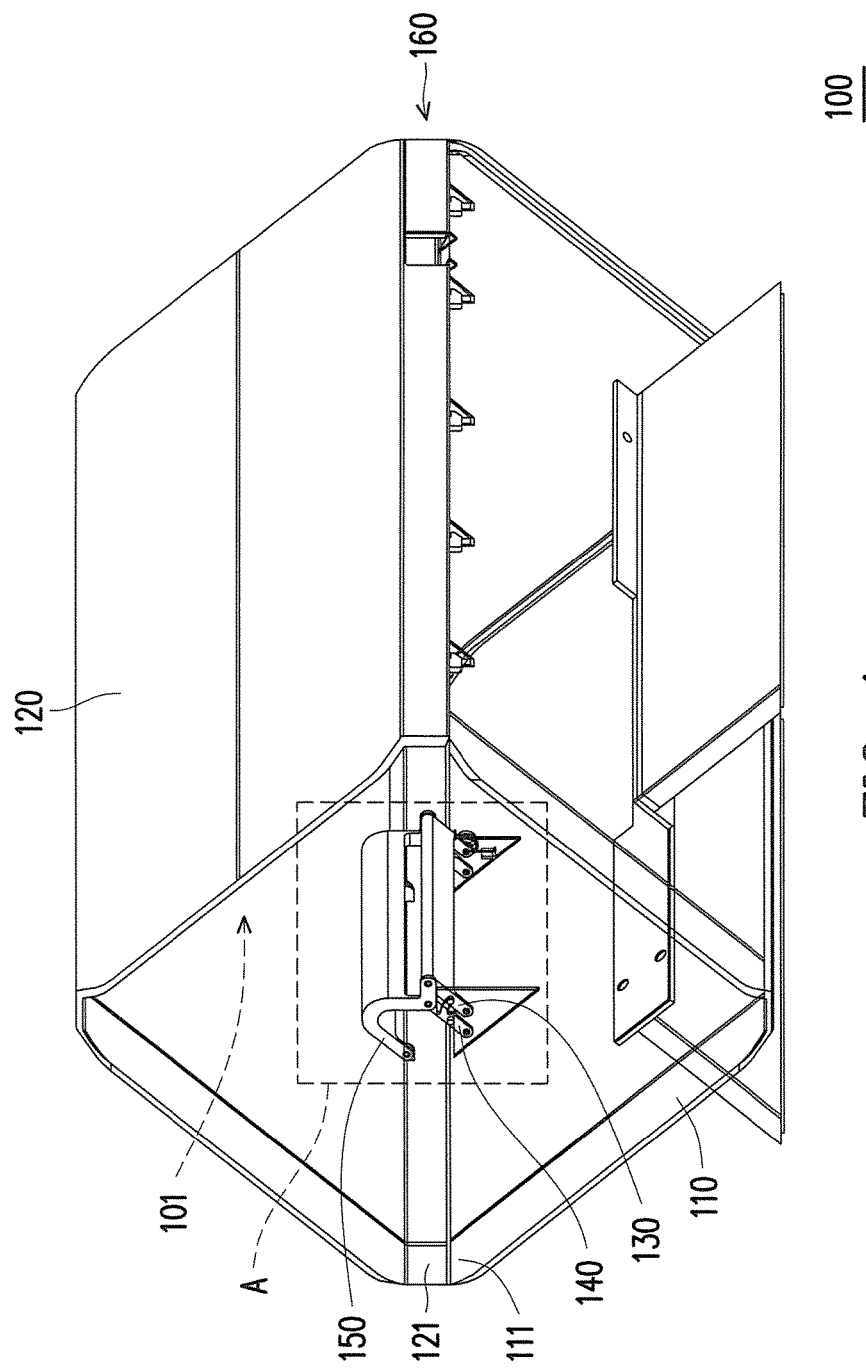
FIG. 1 is a schematic view of a casing according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
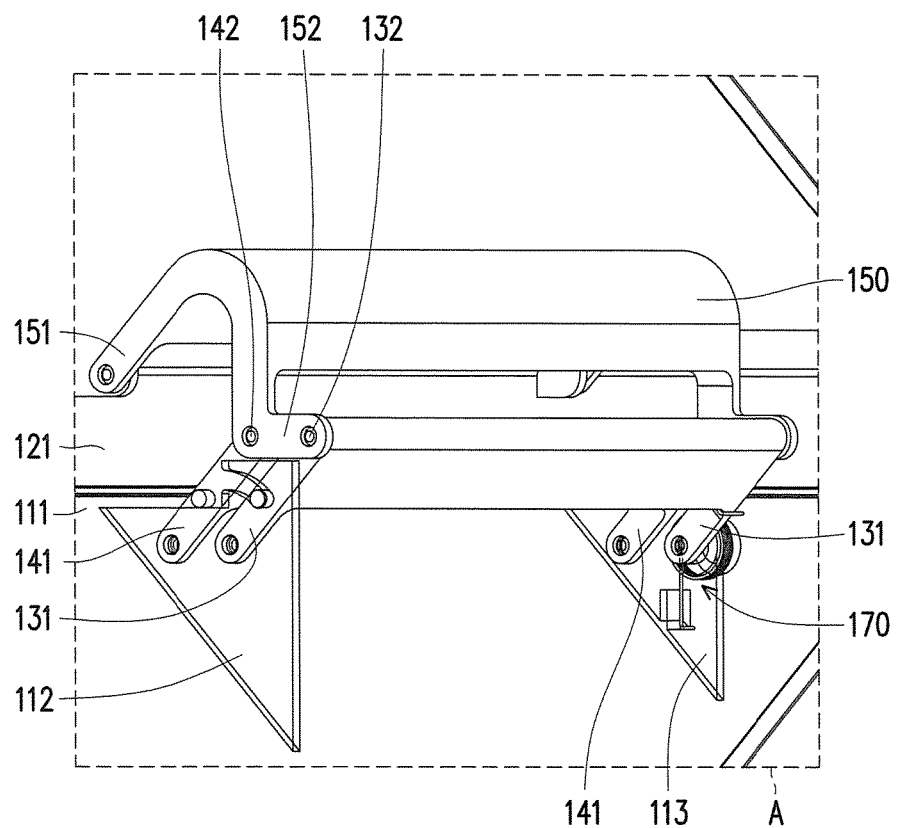
FIG. 2 is an enlarged schematic view of a region A of FIG. 1.
Figure 3:
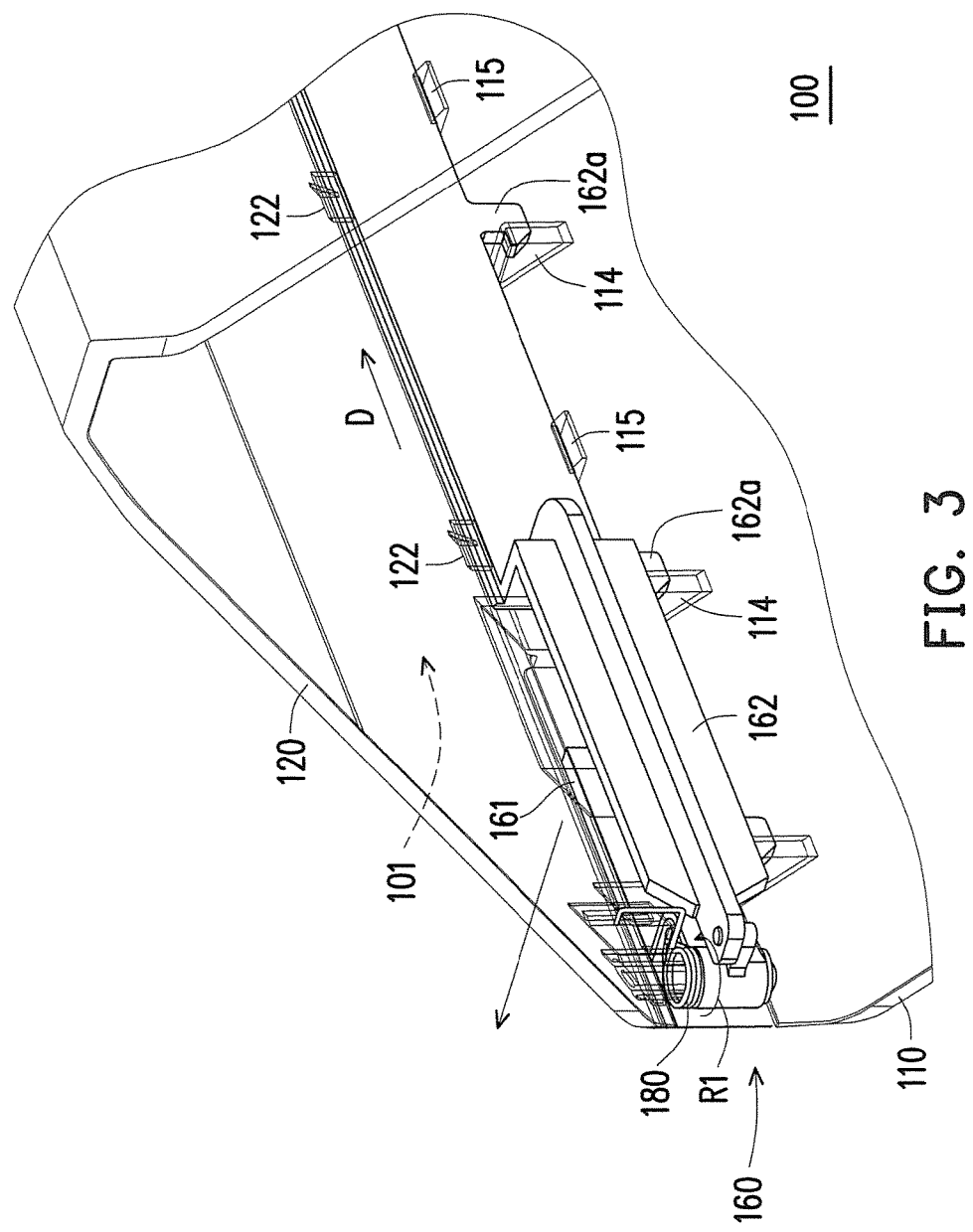
FIG. 3 is a partial enlarged schematic view of the casing of FIG. 1 from another viewing angle.
Figure 4:
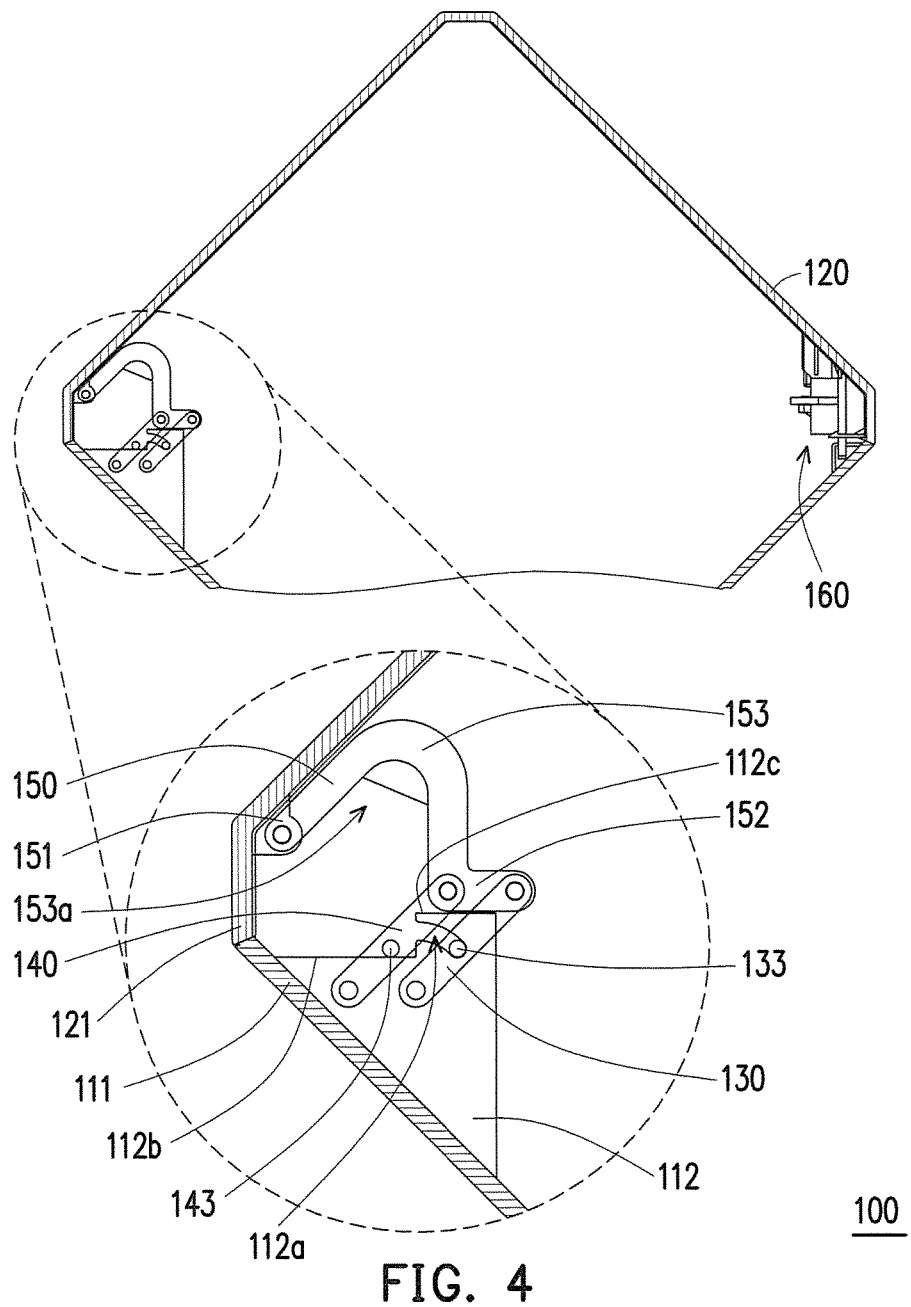
FIG. 4 is a schematic partial cross-sectional view of the casing of FIG. 1.

FIG. 1 is a schematic view of a casing according to an embodiment of the invention. FIG. 2 is an enlarged schematic view of a region A of FIG. 1. FIG. 3 is a partial enlarged schematic view of the casing of FIG. 1 from another viewing angle. FIG. 4 is a schematic partial cross-sectional view of the casing of FIG. 1. For clarity and ease of explanation, a first casing body 110 is depicted as transparent in FIG. 1 to FIG. 3. Referring to FIG. 1 to FIG. 4, in the embodiment, a casing 100 may be an outer casing of a server, a computer host, or an expansion device, which is used to protect electronic components (not shown) assembled therein. The casing 100 may include a first casing body 110, a second casing body 120, first linkages 130 and 140, and a second linkage 150, wherein the first linkages 130 and 140 and the second linkage 150 constitute a linkage assembly, and are disposed in an accommodating space 101 defined by the first casing body 110 and the second casing body 120. Thus, the appearance integrity of the casing 100 can be maintained. As shown in FIG. 1, the first casing body 110 and the second casing body 120 are respectively located at two opposite sides of the first linkages 130 and 140 and the second linkage 150.

The first casing body 110 has a first end portion 111, and the second casing body 120 has a second end portion 121. In the state as shown in FIG. 1 and FIG. 4, the second casing body 120 and the first casing body 110 are fixed to each other, and the first end portion 111 and the second end portion 121 are abutted against each other. On the other hand, the casing 100 further includes a switch assembly 160, wherein the switch assembly 160 and the first end portion 111 are respectively located at two opposite sides of the first casing body 110, and the switch assembly 160 is configured to fix or unfix the first casing body 110 and the second casing body 120. As shown in FIG. 1 and FIG. 3, the switch assembly 160 may include an actuating member 161 and a latching member 162, wherein the actuating member 161 is pivoted to the second casing body 120 and located between the first casing body 110 and the second casing body 120. The latching member 162 is pivoted to the actuating member 161 and located in the accommodating space 101. Specifically, the latching member 162 has a plurality of first latching portions 162a. The first casing body 110 has a plurality of second latching portions 114 and a plurality of first limit portions 115. The second casing body 120 has a plurality of second limit portions 122. The first latching portions 162a, the second latching portions 114, the first limit portions 115, and the second limit portions 122 are all located in the accommodating space 101. Each of the first latching portions 162a and the corresponding second latching portion 114 are latched to each other, such that the first casing body 110 and the second casing body 120 are fixed together. The first limit portions 115 and the second limit portions 122 are respectively located at two opposite sides of the latching member 162, and are respectively mechanically coupled to the latching member 162. Additionally, an arrangement direction of the first limit portions 115 and the second limit portions 122 and an extension direction of the latching member 162 are parallel to each other.

In the embodiment, the second casing body 120 is movably connected to the first casing body 110 through the first linkages 130 and 140 and the second linkage 150, wherein the first linkages 130 and 140 are parallel to each other and disposed adjacent to the first end portion 111. The first linkages 130 and 140 are respectively pivoted to the first casing body 110 so as to be rotated relative to the first casing body 110. On the other hand, the second linkage 150 is disposed adjacent to the second end portion 121, wherein the second linkage 150 is pivoted to the second casing body 120 and the first linkages 130 and 140 so as to be rotated relative to the second casing body 120 and the first linkages 130 and 140.

As shown in FIG. 1, FIG. 2, and FIG. 4, the first casing body 110 includes a first base 112 and a second base 113 arranged side-by-side and located in the accommodating space 101. Specifically, the first linkage 130 has a first pivot portion 131 and a second pivot portion 132 opposite to each other, and the first linkage 140 has a first pivot portion 141 and a second pivot portion 142 opposite to each other. The first pivot portions 131 and 141 are both pivoted to the first base 112 and the second base 113, and the second pivot portions 132 and 142 are respectively pivoted to the second linkage 150. On the other hand, the second linkage 150 has a third pivot portion 151 and a fourth pivot portion 152 opposite to each other, wherein the third pivot portion 151 is pivoted to the second casing body 120, and the fourth pivot portion 152 and the second pivot portions 132 and 142 are pivoted to each other.

In the embodiment, the first base 112 may have a sliding groove 112a and a stopper portion 112b, wherein the sliding groove 112a may be an arc sliding groove, and the stopper portion 112b is located at a side of the sliding groove 112a. The first linkage 130 is provided with a first pin 133 located between the first pivot portion 131 and the second pivot portion 132. The second linkage 140 is provided with a second pin 143 located between the first pivot portion 141 and the second pivot portion 142. The first pin 133 and the second pin 143 are respectively disposed corresponding to the first base 112. When the second end portion 121 and the first end portion 111 are abutted against each other, the first pin 133 is slidably disposed in the sliding groove 112a and abutted against a bottom of the sliding groove 112a. The second pin 143 is located outside the sliding groove 112a and leaned against the stopper portion 112b. On the other hand, the first base 112 further has a limit portion 112c, wherein the limit portion 112c is located above the sliding groove 112a. When the second end portion 121 and the first end portion 111 are abutted against each other, the fourth pivot portion 152 and the limit portion 112c are abutted against each other. Therefore, for the first latching portion 162a and the second latching portion 114 latched to each other, the first pin 133 abutted against to the bottom of the sliding groove 112a, the second pin 143 and the stopper portion 112b abutted against each other, and the fourth pivot portion 152 and the limit portion 112c abutted against each other, the first casing body 110 and the second casing body 120 can be more firmly fixed together and not be easily separated from each other by external force.

As shown in FIG. 1 and FIG. 2, the casing 100 further includes an elastic member 170, such as a torsion spring. Two ends of the elastic member are respectively connected to the first linkage 130 and the second base 113, and the switch assembly 160 and the elastic member 170 are respectively located at two opposite sides of the first casing body 110. When the second end portion 121 and the first end portion 111 are abutted against each other, and the switch assembly 160 fixes the first casing body 110 and the second casing body 120, the elastic member 170 is compressed between the first linkage 130 and the second base 113.

Figure 5:
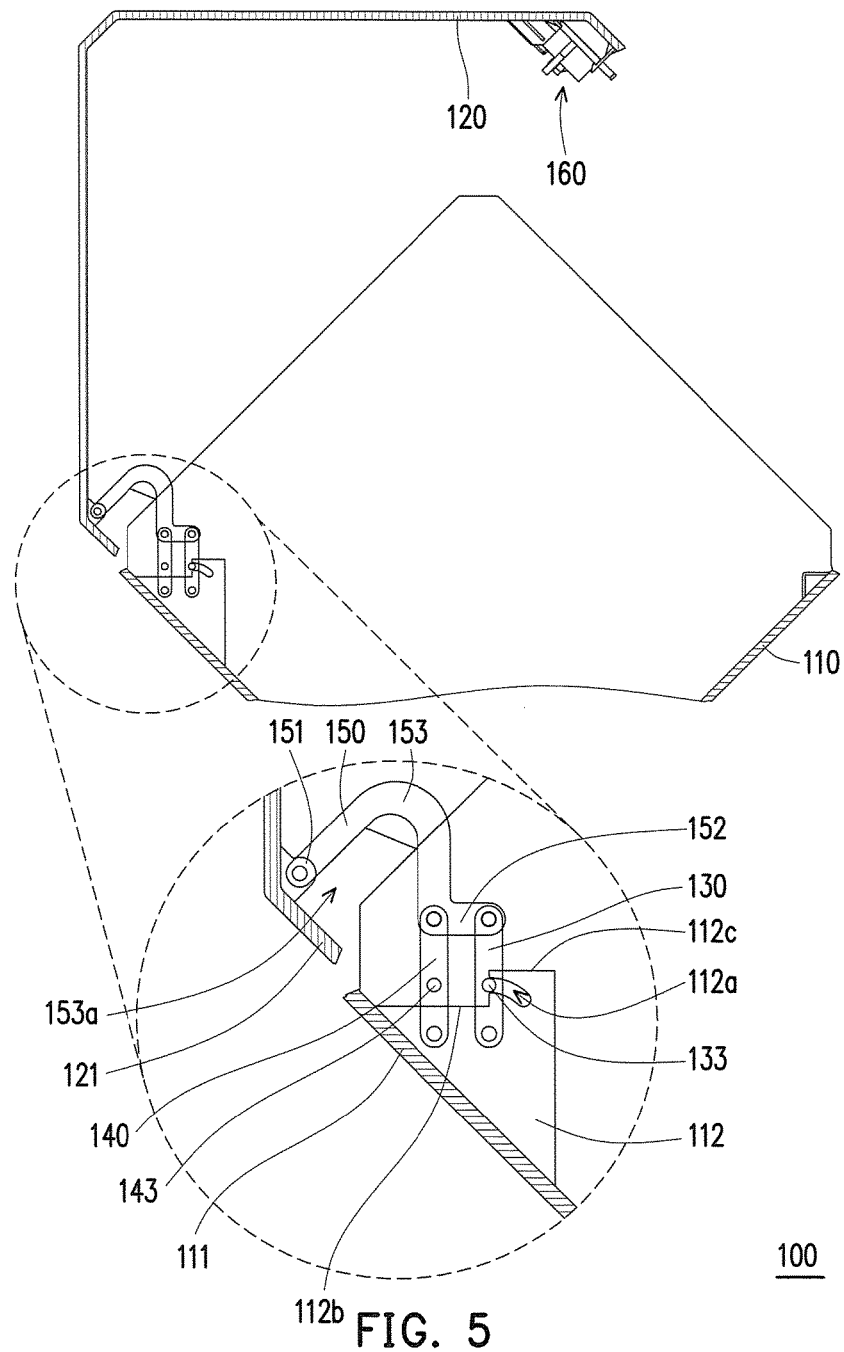

FIG. 5 and FIG. 6 are schematic views of a second casing body of FIG. 4 moving relative to a first casing body to be separated from the first casing body. Referring to FIG. 1 to FIG. 5, when the user wants to separate the second casing body 120 from the first casing body 110, it is required to unfix the second casing body 120 and the first casing body 110 through the switch assembly 160. For example, the user can apply a force to move the actuating member 161 (the force direction is an arrow as shown in FIG. 3) to be rotated relative to the second casing body 120 along a rotation direction R1 and to drive the latching member 162 to be moved along a moving direction D parallel to an arrangement direction of the first limit portions 115 and the second limit portions 122 limited to the first limit portions 115 and the second limit portions 122, so as to make each of the first latching portions 162a be separated from the corresponding second latching portion 114. Thereby, a latching relationship between the first latching portion 162a and the second latching portion 114 is released. At this time, an elastic potential energy stored when the elastic member 170 is compressed can be released to drive the first linkage 130 to be rotated relative to the first casing body 110. Thereby, the second casing body 120 is slightly lifted from the first casing body 110, such that the first end portion 111 and the second end portion 121 are separated. It should be mentioned that a pivot between the actuating member 161 and the second casing body 120 is provided with an elastic member 180, wherein the elastic member 180 is a torsion spring, and two end portions of the torsion spring are respectively fixed to the actuating member 161 and the second casing body 120. When the user applies a force to move the actuating member 161 (the force direction is an arrow as shown in FIG. 3) to be rotated relative to the second casing body 120 along the rotation direction R1, the elastic member 180 is elastically deformed. After the user stops applying the force to the actuating member 161, an elastic potential energy stored when the elastic member 180 is elastically deformed can be released to drive the actuating member 161 to be reversely rotated along the rotation direction R1, so as to drive the latching member 162 to be reversely moved along the moving direction D. Thus, each of the first latching portions 162a and the corresponding second latching portion 114 are latched to each other again.

Then, the second casing body 120 is lifted by applying a force, such that the first linkages 130 and 140 are rotated relative to the first casing body 110 driven by the second linkage 150. Thereby, the first end portion 111 and the second end portion 121 are separated from each other, the first pin 133 and the bottom of the sliding groove 112a are separated from each other, the second pin 143 and the stopper portion 112b are separated from each other, and the fourth pivot portion 152 and the limit portion 112c are separated from each other. Specifically, the second linkage 150 is rotated relative to the first casing body 110 through the first linkages 130 and 140 parallel to each other, and the first pin 133 of the first linkage 130 is moved relative to the first base 112 along the sliding groove 112a. Thus, the stability when the second casing body 120 is moved relative to the first casing body 110 to be separated from each other can be increased. On the other hand, the movement of the first linkages 130 and 140 parallel to each other relative to the first casing body 110 can make the second end portion 121 of the second casing body 120 be separated from the first end portion 111 of the first casing body 110 first, so as to prevent the second casing body 120 from generating the structural interference with the first casing body 110.

As shown in FIG. 5, the second casing body 120 continues to be moved relative to the first casing body 110 through the second linkage 150 and the first linkages 130 and 140, so as to make the first pin 133 be moved along the sliding groove 112a and make the first pin 133 and the second pin 143 be moved toward the stopper portion 112b. When the first linkages 130 and 140 are perpendicular to the stopper portion 112b, the first pin 133 is still located in the sliding groove, and the first pin 133 and the second pin 143 are separated from the stopper portion 112b. Then, the first pin 133 and the second pin 143 continue to be moved toward the stopper portion 112b. When the first pin 133 and the second pin 143 are inclined to the stopper portion 112b, the first pin 133 is moved outside the sliding groove 112c, and the first pin 133 and the second pin 143 are abutted against the stopper portion 112b as shown in FIG. 6. After the first pin 133 and the second pin 143 are abutted against the stopper portion 112b, the position of the second linkage 150 is temporarily fixed.

In the embodiment, the second linkage 150 has a bending portion 153 connected to the third pivot portion 151 and the fourth pivot portion 152, wherein the bending portion 153 is located above the first base 112 and defines an abdicate groove 153a. As shown in FIG. 4, the abdicate groove 153a faces the first base 112. As shown in FIG. 6, when the first pin 133 and the second pin 143 are inclined to the stopper portion 112b, and the first pin 133 and the second pin 143 are abutted against the stopper portion 112b, the fourth pivot portion 152 is parallel to the stopper portion 112b, and the bending portion 153 and the abdicate groove 153a are moved outside the first end portion 111. At this time, the second casing body 120 can be rotated relative to the third pivot portion 151 along the rotation direction R, so as to make the second end portion 121 be moved into the abdicate groove 153a. On the other hand, the second end portion 121 moved in the abdicate groove 153a and a positioning portion 154 in the abdicate groove 153a can be abutted against each other, so as to make the second casing body 120 stop rotating relative to the third pivot portion 151 along the rotation direction R. Thereby, the second casing body 120 is temporarily fixed as the state shown in FIG. 6, so as to facilitate the user to repair or replace the electronic components (not shown).

In summary, the linkage assembly of the invention is composed of the two parallel first linkages and the second linkage and disposed in the casing. Thus, the appearance integrity of the casing can be maintained. Specifically, each of the first linkages is pivoted to the first casing body and the second linkage, and the second linkage is pivoted to the second casing body. In other words, the first casing body and the second casing body can be connected to each other through the two parallel first linkages and the second linkage, and the second casing body can be moved relative to the first casing body through the two parallel first linkages and the second linkage. In the process that the second casing body is moved relative to the first casing body through the two parallel first linkages and the second linkage, the movement of the two parallel first linkages relative to the first casing body can make the second end portion of the second casing body be separated from the first end portion of the first casing body first without generating the structural interference. At the same time, the stability when the second casing body is moved relative to the first casing body to be separated from each other can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A casing, comprising:
a first casing body, having a first end portion;
a second casing body, movably connected to the first casing body, wherein the second casing body has a second end portion, and the first end portion and the second end portion are abutted against each other or separated from each other;
at least one first linkage, disposed adjacent to the first end portion and pivoted to the first casing body; and
a second linkage, disposed adjacent to the second end portion, wherein the second linkage is pivoted to the second casing body and the first linkage, and the first casing body and the second casing body are respectively located at two opposite sides of the first linkage and the second linkage, when the second end portion and the first end portion are abutted against each other, the second casing body is capable of moving relative to the first casing body through the second linkage and the first linkage so as to make the second end portion be separated from the first end portion,
wherein the first casing body comprises a first base and a second base arranged side-by-side, the first linkage has a first pivot portion and a second pivot portion opposite to each other, the first pivot portion is pivoted to the first base and the second base, and the second pivot portion is pivoted to the second linkage,
wherein the first base has a sliding groove, a number of the first linkage is two, and the two first linkages are parallel to each other, wherein one of the first linkages is provided with a first pin located between the corresponding first pivot portion and the second pivot portion, another one of the first linkages is provided with a second pin located between the corresponding first pivot portion and the second pivot portion, and the first pin and the second pin are respectively disposed corresponding to the first base, when the second end portion and the first end portion are abutted against each other, the first pin is slidably disposed in the sliding groove and abutted against a bottom of the sliding groove, and the second pin is located outside the sliding groove.

2. The casing according to claim 1, wherein the first base further has a stopper portion, the stopper portion is located at a side of the sliding groove, and the second pin is abutted against the stopper portion, after the second casing body is moved relative to the first casing body through the second linkage and the two first linkages so as to make the second end portion be separated from the first end portion, the first pin is moved along the sliding groove, and the first pin and the second pin are moved toward the stopper portion, when the two first linkages are perpendicular to the stopper portion, the first pin is located in the sliding groove, and the first pin and the second pin are separated from the stopper portion, when the two first linkages are inclined to the stopper portion, the first pin is located outside the sliding groove, and the first pin and the second pin are abutted against the stopper portion.

3. The casing according to claim 2, wherein the second linkage has a third pivot portion and a fourth pivot portion opposite to each other, the third pivot portion is pivoted to the second casing body, and the fourth pivot portion and each of the second pivot portions are pivoted to each other.

4. The casing according to claim 3, wherein the first base further has a limit portion, and the limit portion is located above the sliding groove, when the second end portion and the first end portion are abutted against each other, the fourth pivot portion and the limit portion are abutted against each other.

5. The casing according to claim 3, wherein the second linkage has a bending portion connected to the third pivot portion and the fourth pivot portion, the bending portion defines a groove, and the groove faces the first base, when the two first linkages are inclined to the stopper portion, and the first pin and the second pin are abutted against the stopper portion, the fourth pivot portion is parallel to the stopper portion, and the second casing body is capable of rotating relative to the third pivot portion so as to make the second end portion move in the groove.

6. The casing according to claim 1, further comprising:
an elastic member, connected to the first linkage and the second base, when the second end portion and the first end portion are abutted against each other, the elastic member is compressed between the first linkage and the second base.

7. The casing according to claim 6, further comprising:
a switch assembly, wherein the switch assembly and the elastic member respectively located at two opposite sides of the first casing body and the switch assembly is configured to fix or unfix the first casing body and the second casing body.

8. The casing according to claim 7, wherein the switch assembly comprises:
an actuating member, pivoted to the second casing body and located between the first casing body and the second casing body; and
a latching member, pivoted to the actuating member, wherein the latching member has a plurality of first latching portions, the first casing body has a plurality of second latching portions and a plurality of first limit portions, the second casing body has a plurality of second limit portions, each of the first latching portions and the corresponding second latching portion are latched to each other, and the first limit portions and the second limit portions are respectively located at two opposite sides of the latching member, and are respectively mechanically coupled to the latching member,
when the actuating member is rotated relative to the second casing body along a rotation direction, the latching member is moved along a moving direction driven by the actuating member and limited to the first limit portions and the second limit portions, so as to make each of the first latching portions be separated from the corresponding second latching portion.

* * * * *